(12) United States Patent
Venkata et al.

(10) Patent No.: US 10,403,330 B1
(45) Date of Patent: Sep. 3, 2019

(54) POWER NOISE REDUCTION TECHNIQUE FOR HIGH DENSITY MEMORY WITH GATING

(71) Applicant: Micron Technology, Inc., Boise, ID (US)

(72) Inventors: Harish N. Venkata, Allen, TX (US); Yu-Feng Chen, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/163,720

(22) Filed: Oct. 18, 2018

(51) Int. Cl.
| | |
|---|---|
| *G05F 1/10* | (2006.01) |
| *G11C 5/14* | (2006.01) |
| *G06F 12/126* | (2016.01) |
| *G11C 7/10* | (2006.01) |
| *H03K 19/20* | (2006.01) |
| *G06F 12/06* | (2006.01) |

(52) U.S. Cl.
CPC .......... *G11C 5/145* (2013.01); *G06F 12/0623* (2013.01); *G06F 12/126* (2013.01); *G11C 7/1096* (2013.01); *H03K 19/20* (2013.01)

(58) Field of Classification Search
CPC ..... G11C 16/30; G11C 16/08; G11C 16/0483; G11C 16/10; G11C 16/26
See application file for complete search history.

(56) References Cited

U.S. PATENT DOCUMENTS

| | | | | |
|---|---|---|---|---|
| 5,982,224 A | * | 11/1999 | Chung | H02M 3/073 307/110 |
| 2019/0019539 A1 | * | 1/2019 | Michael | G11C 16/12 |

* cited by examiner

*Primary Examiner* — Sibin Chen
(74) *Attorney, Agent, or Firm* — Fletcher Yoder, P.C.

(57) ABSTRACT

Memory devices may have internal circuitry that employs voltages higher than voltages provided by an external power source. Charge pumps are DC/DC converters that may be used to generate, internally, higher voltages for operation. The number of available charge pumps in a memory device may be higher than the number used for certain memory operations. Gating circuitry may be used to selectively enable charge pump cores based on power demands that may be associated with a mode of operation and/or a command.

6 Claims, 2 Drawing Sheets

POWER NOISE REDUCTION TECHNIQUE FOR HIGH DENSITY MEMORY WITH GATING

BACKGROUND

1. Field of the Present Disclosure

This disclosure relates to memory devices, and more specifically, to charge pump supply circuitry in memory devices.

2. Description of Related Art

Memory devices, such as random access memory (RAM) devices, dynamic RAM devices (DRAMs), static RAM devices (SRAMs), or flash memories, are often used in electronic systems to provide memory functionality to facilitate data processing operations and/or facilitate data storage during data processing operations. To that end, these memory devices may have addressable memory elements arranged in memory arrays and/or banks. These memory devices may also include an input/output (I/O) interface that provides data access between memory elements and processing circuitry (e.g., a processor, a microcontroller, a system-on-chip). The I/O interface of the memory device may be coupled to the memory elements through an internal data path that may include circuitry for reading or writing data bits in the memory elements.

Several operations in the memory device may employ voltages that may be higher than the power supply voltages of the memory device. For example, certain memory devices may be coupled to a power supply with a voltage of about 1.2V and/or about 2.5V, and may have certain operations that employ voltages in a range such as between 4.5V-5V. To perform such operations, charge pump power supplies, may be employed to provide higher voltages. More generally, charge pumps may be voltage generators that may provide voltages larger than input voltages. As the current and voltage demands of memory devices increase with memory density and memory speed, improvements in the charge pump technology may allow reduced voltage, and thus, more reliable systems.

BRIEF DESCRIPTION OF THE DRAWINGS

Various aspects of this disclosure may be better understood upon reading the following detailed description and upon reference to the drawings in which.

DETAILED DESCRIPTION

Figure 1:
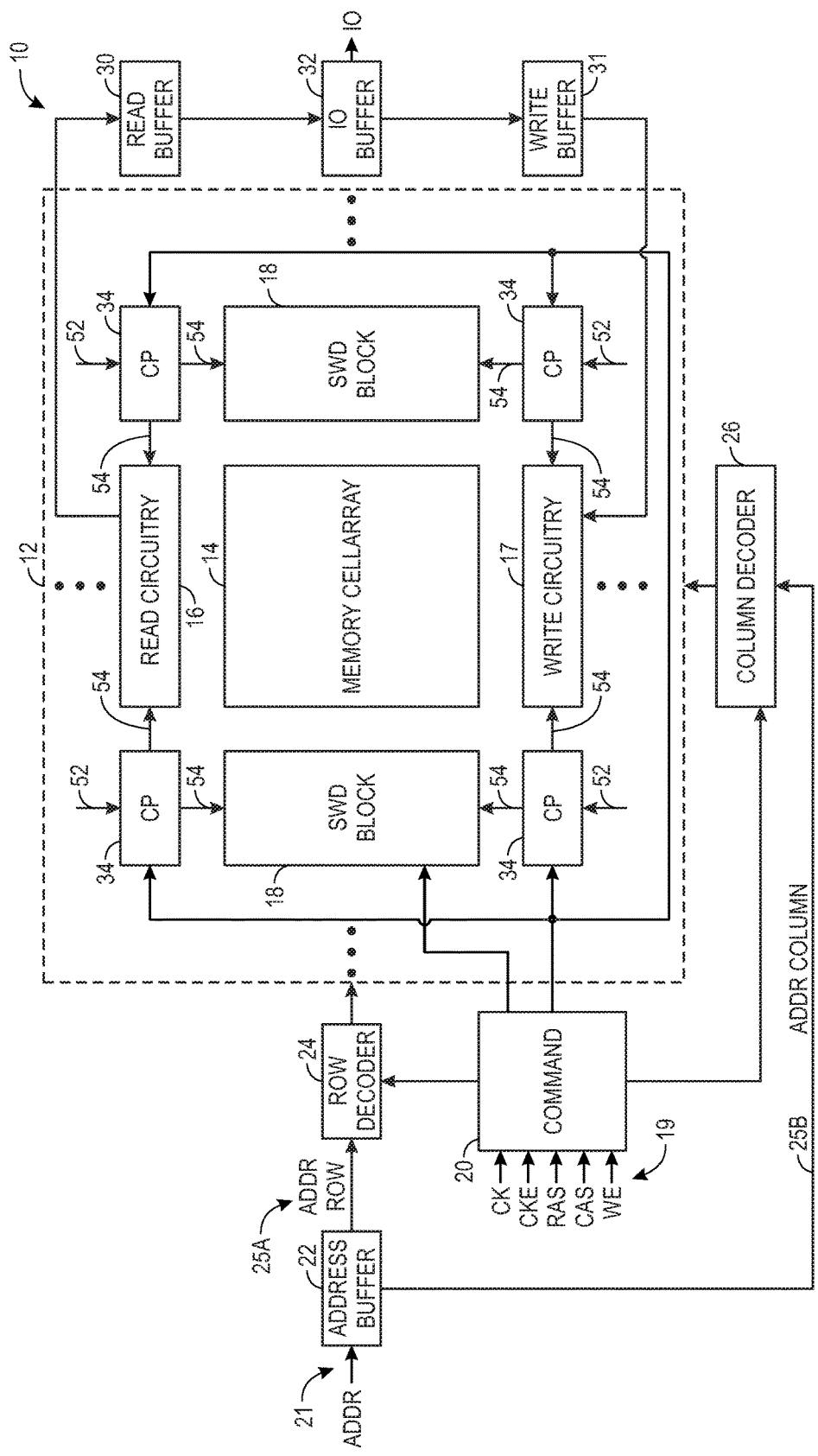
FIG. 1 is a block diagram of a memory device with a configurable number of enabled charge pumps, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may store data using addressable memory elements (e.g., memory rows or columns), which may be disposed in memory banks. Examples of addressable memory devices include random access memory (RAM) devices, dynamic RAM (DRAM) devices such as synchronous DRAM (SDRAM) devices, double data rate SDRAM devices (e.g., DDR SDRAM, DDR2 SDRAM, DDR3 SDRAM, DDR4 SDRAM), and graphics DDR SDRAM devices (e.g., GDDR3 SDRAM, GDDR4 SDRAM), as well as static RAM (SRAM) devices, and/or flash memory devices, among others.

Processing circuitry in the electronic systems may access (e.g., read/write) the memory elements by interacting with an input/output (I/O) interface and a command interface. As an example, a processor may store information by providing a write command and/or an address for a memory element, and read stored information from a particular memory element from the memory device by providing a read command and/or an address. The commands and/or addresses may be provided via the command interface, and the requested information (e.g., data bits) may be retrieved via the I/O interface.

The power to perform memory operations, such as read, write, refresh, activate (e.g., activation of a row or a column), precharge (e.g., deactivation of a row or a column) operations, may be obtained from power supply connections (e.g., power supply ($V_{DD}$), activating power supply ($V_{PP}$), ground supply ($V_{SS}$)) with the electronic device. For example, the memory device may have external connections (e.g., pins) associated with power supply connections, which may be coupled to pins in a socket of a printed circuit board (e.g., a motherboard). The voltages and tolerances of the power supply connection may be specified in a standard for the memory device. For example, DDR4 may include a $V_{DD}$ specification of about 1.2V and a $V_{PP}$ specification of about 2.5V. However, certain operations within the memory device may benefit from a higher or lower voltage (e.g., higher than 2.5V, lower than 0V). To that end, the memory devices may include analog power supplies, such as charge pumps and/or charge pump cores, (e.g., charge pumps), which may be DC/DC converters that generate higher or lower voltages from the voltages provided by the power supply lines.

Charge pumps may, in general, generate voltage increases by employing a switching device (e.g., a transistor) or some of switching to controls connections across energy storage devices (e.g., a capacitor). Based on, among other things, the switching frequency, the duty cycle of the switching signal, and the input voltages, a target output voltage and/or the current capacity of the charge pump may be adjusted. Operation of charge pumps may demand substantial currents during short periods of time, to charge the energy storage devices. As a result, operation of charge pumps may cause interference with other circuitry in the memory devices. Examples of such interference include voltage drop noise (IR drop noise), which may be caused by the competition for electrical power during due to the large currents used by the charge pump.

Memory devices may include several charge pumps and, conventionally, all charge pumps are enabled upon request. As the size of memory devices increases and the number of on-die memory increases (e.g., 8Gb, 16Gb, 32Gb per memory die), the number charge pumps on the die may become large. Due to the impact on the operation of the memory devices, strategies for moderation in the use of charge pumps during operation may lead to improvements in the performance of the memory device. Embodiments described herein include systems and methods for memory devices that may allow selective activation of charge pumps and/or charge pump cores having smaller charge demands, which may be satisfied with activation of a subset of charge pumps or charge pump cores. For example, refresh operations, which may have the highest charge demand in some memory devices, may activate most or all available charge pumps or charge pump cores, while read operations, which may have a moderate charge demand, may activate a fraction of the available charge pumps. The selective activation discussed herein may employ gating circuitry that may be used to control the driving of pump charges.

With the foregoing in mind, FIG. 1 is a block diagram of a memory device 10 in accordance with an embodiment of the present invention. The memory device 10 may have one or more memory banks 12, which may include one or more memory cell arrays 14. Each memory cell array 14 may be coupled to read circuitry, such as one or more read blocks 16 (e.g., sense amplify circuitry) that may facilitate read operations, and write circuitry, such as write blocks 17 that may facilitate write operations. In some embodiments, a single block may be used to perform part or all of the functions performed by the read blocks 16 and the write blocks 17. Read blocks 16 and/or write blocks 17 may operate by amplifying and coordinating local input/output (I/O) lines coupled to the memory cell array 14. The memory cell array 14 may also be coupled to subword driver (SWD) blocks 18. The SWD blocks 18 may facilitate read and write operations by providing signals to activate memory rows or memory columns in the memory cell array 14. Charge pumps 34 may be disposed on the memory device (e.g., near memory banks 12 in the periphery of the memory device die, etc.) to provide an electrical signal 28 the read blocks 16, write blocks 17, and/or the SWD blocks 18. Moreover, charge pumps 34 may receive one or more electrical power signals 52, (e.g., $V_{DD}$, $V_{PP}$, $V_{SS}$).

The logic blocks in the memory banks 12 may be controlled by clock and/or command signals 19, which may be received by a command block 20. Command block 20 may decode the clock and/or command signals 19 to generate various internal signals to control internal data circuitry, such as address buffers 22, decoders such as row decoder 24 and column decoder 26, read buffer 30, write buffer 31, charge pumps 34, and/or input/output (I/O) buffer 32. For example, when an operation demands a high voltage signal 54 from the charge pumps 34, the command block 20 may provide instructions to activate the charge pumps 34 and provide the high voltage signal 54 based on the device power signals 52. In order to address data, the address buffer 22 may receive address signal 23. The clock and/or command signals 19 and the address signal 23 may be provided by processing circuitry coupled to the memory device, as discussed above.

In order to manipulate data at an address, an external device may also provide an address signal 21, in addition to the clock and/or command signals 19. The address signal 21 may be decoded in the address buffer 22 into a row address 25A and column address 25B. The row address 25A may be provided to a row decoder 24 and the column address 25B may be provided to a column decoder 26. The row decoder 24 and the column decoder 26 may be used to control the appropriate SWD block 18 to activate the memory cells associated with the requested address signal 23.

For example, in a read operation, the memory cells associated with the row address 25A and the column address 25B may be activated by a SWD block 18, the read block 16 may generate a data read signal, and read buffer 30 and I/O buffer 32 may amplify and transport the read data to an external device. During a write operation, the memory cells associated with the row address 25A and the column address 25B may be activated by the SWD block 18, the I/O buffer 32 may latch the incoming data from the external device, and the write buffer 31 and the write block 17 may store the read data to an external device. Other operations may also be performed, such as refresh operation that refreshes the data in the entire memory device. In the refresh operation, the SWD block 18 may activate all rows in the memory cell array 14 to avoid data loss. In the processes related with these operations, the charge pumps 34 may be activated and/or de-activated to provide adequate voltages, as discussed above.

Figure 2:
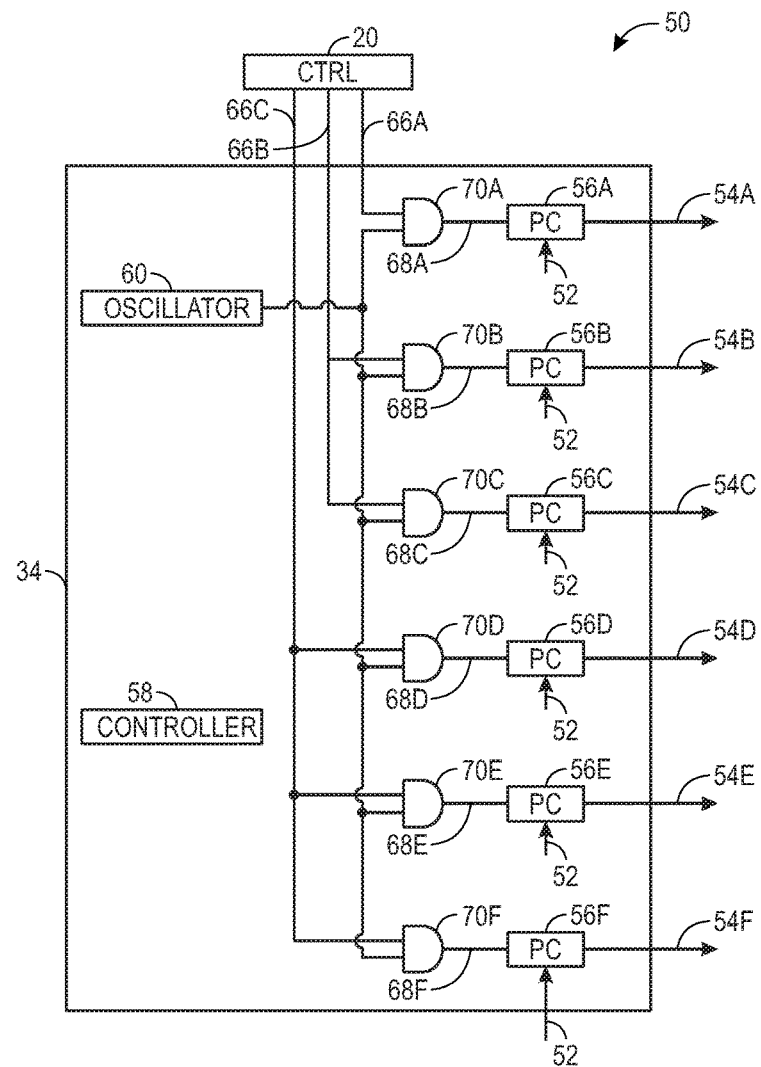
FIG. 2 is a block diagram of a programmable charge pump circuit that may include logic for gating charge pump cores, in accordance with an embodiment.

FIG. 2 illustrates a block diagram 50 of a charge pump 34, which may enabled or disabled, as discussed herein. The block diagram 50 is provided to illustrate general functionality of a charge pump 34, and it is understood that the methods and systems described herein may be adjusted and/or applied to other charge pump systems or other similar DC/DC converters. As illustrated, the charge pump 34 may operate as a DC/DC converter that receives one or more input power signals 52 and may provide output electrical signals with a higher and/or lower voltage. To that end, the charge pump 34 may have pump cores 56A, 56B, 56C, 56D, 56E, 56E, and 56F, which may provide output electrical signals 54A, 54B, 54C, 54D, 54E, and 54F, and which may include switching circuitry and energy storage circuitry. The switching circuitry may include, for example, transistors and/or diodes and the energy storage circuitry may include, for example, capacitors.

Charge pump 34 may also include a pump controller 58 and a pump oscillator 60. The pump oscillator 60 may provide an oscillator signal 62 that regulates the operation of the pump cores 56. The frequency and/or the duty cycle from the signal 62 may be controlled to change the voltage level and/or the available current of the output electrical signal 54. The pump controller 58 may be included or be coupled to sensors (e.g., voltage sensors or other feedback circuitry) that monitor the output electrical signal 54A-F of the pump cores 56A-F and adjust the operation of the pump oscillator 60 accordingly. For example, if the current demands on the pump cores 56A-F cause a voltage drop in the output electrical signal 54A-F, the pump controller 58 may sense the voltage drop and cause the oscillator 60 to increase its frequency to provide more charge.

The charge pump 34 may also receive a control signals from a memory device controller (e.g., command block 20) to enable, disable, or adjust a mode of the charge pump cores 56. Generally, the control signals may be used to gate the oscillator signal 62 to produce gated oscillator signals. The pump controller 58 may receive the control signals 66A, 66B, and/or 66C to selectively gate one or more pump cores 56A-F. Gating circuitry, which in the illustrated example include AND gates 70A, 70B, 70C, 70D, 70E, and 70F, may be used to gate the oscillator signal 62 based on the control signals 66A, 66B, or 66C. Each of the AND gates 70A, 70B, 70C, 70D, 70E, and 70F may be associated with a charge pump core 56A, 56B, 56C, 56D, 56E, and 56F. The operation of the gating circuitry may produce gated oscillator signals such as enable signals 68A, 68B, 68C, 68D, 68E, and 68F. As an example, AND gate 70A may gate charge pump core 56A with signal 66A to produce signal 68A. Similarly, AND gates 70B and 70C may gate charge pump cores 50B and 50C, respectively, with signal 66B, thereby producing signals 68B, and 68C as illustrated. AND gates 70D, 70E, and 70F may gate pump cores 50D, 50E, and 50F with signal 66C, thereby producing signals 68D, 68E, and 68F as illustrated.

The control signals (e.g., control signals 66A-C) may be used to adjust the number of active charge pump cores. In some embodiments, each charge pump core (e.g., charge pump cores 56A-F) may be controlled by individual control signals and the number of enabling control signals may determine the number of charge pump cores. In some embodiments, each control signal may control a group of control signals, to reduce the number of control signals in the memory die. In the charge pump 34 illustrated in FIG. 2, each control signal controls a different number of charge pump cores. For example, control signal 66A controls one charge pump, namely charge pump 56A, control signal 66B controls two charge pumps, namely charge pumps 56B and 56C, and control signal 66C controls three charge pumps, namely charge pumps 56D-F. This distribution may be used to obtain different levels of pump core activation with 3 signals.

Control signals 66A, 66B, and 66C may individually be used to enable 1, 2, and 3 pump cores, respectively. To enable 4 pumps, control signals 66A and 66C may be used. To enable 5 pumps, control signals 66B and 66D may be used. To enable all pumps, activation of all control signals may be used. It should be understood that other coding systems may be used to control the number charge pump cores activated, and the coding illustrated in FIG. 2 is one example of an implementation. In some embodiments, each activation code may be associated with a mode. For example, mode A may be associated with one pump core, and mode B may be associated with two charge pump cores. More generally, modes may be associated with a number of activated charge pump cores, the disposition of activated charge pumps in the memory device, and/or a specific command associated with a mode. For example, in some embodiments, a mode A may be associated with a refresh command, mode B may be associated with a read command, and mode C may be associated with a write command. Modes may also be associated with a power operation mode (e.g., high performance mode, energy saving mode, energy conservation mode).

Figure 3:
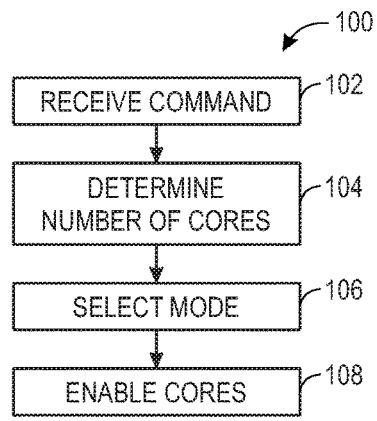
FIG. 3 is a flow chart illustrating a method for selective gating of charge pumps during operation of a memory device, in accordance with an embodiment.

FIG. 3 illustrates a method 100 for selective activation of charge pump cores, as discussed above. In a process block 102, a command may be received by a controller in the memory device (e.g., command block 20). The command may be a memory device operation, such as read instruction, a write instruction, or a refresh instruction. In a process block 102, the controller may determine a charge demand associated with the command (e.g., current demand, voltage demand). The controller may, based on the charge demand, determine the number of enabled charge pumps and/or which charge pumps should be enabled in process block 104. The relationship between the command and the enabled charge pumps may be stored in a memory and/or a logic block within the memory device. In some embodiments, less than 10% of the charge pumps may be used during normal operations, 40-50% of the charge pumps during heavy access to the memory banks, and over 90% of the charge pumps during a refresh operation. As discussed above, in some systems, a mode may be selected in a process block 106. The mode may be associated with the number of core pumps determined in process block 104 or directly associated with the command received in process block 102. In a process block 108, control signals (e.g., control signals 66A-C) may be employed to gate the charge pump cores, as discussed above. The control signals may fallow an encoding associated with a mode or associated with the number of cores, as illustrated.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device comprising:
a memory controller configured to:
  receive an instruction associated with a first memory operation;
  determine a mode from a set of modes, based on the first memory operation; and
  generate a set of control signals based on the mode; and
a charge pump comprising:
  an oscillator;
  a set of gates, each gate of the set of gates configured to receive a control signal of the set of control signals and an oscillator signal from the oscillator; and
  a set of charge pump cores, each charge pump core configured to receive a gated oscillator signal from an associated gate of the set of gates and a first voltage, and to generate a second voltage higher than the first voltage,
wherein the set of control signals comprises a first control signal that enables a first number of charge pump cores and a second control signal that enables a second number of charge pump cores and the first number is different from the second number.

2. The memory device of claim 1, wherein the first voltage comprises an activating power supply (VPP), or a power supply (VDD).

3. The memory device of claim 1, wherein each gate of the set of gates comprises an AND gate.

4. The memory device of claim 1 wherein the mode is associated with a number of charge pump cores to be enabled.

5. The memory device of claim 1, wherein the first control signal is provided to the first number of gates of the set of gates.

6. The memory device of claim 1, wherein the first memory operation comprises a read operation, a write operation, or a refresh operation.

* * * * *